(12) United States Patent
Moon

(10) Patent No.: US 6,812,498 B1
(45) Date of Patent: Nov. 2, 2004

(54) MULTI-COLOR LIGHT EMITTING DIODE PACKAGE

(75) Inventor: Seoung Ju Moon, Suwon (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 10/673,264

(22) Filed: Sep. 30, 2003

(30) Foreign Application Priority Data

Jun. 26, 2003 (KR) .................................. 10-2003-0041839

(51) Int. Cl.[7] .............................................. H01L 27/15
(52) U.S. Cl. ........................... 257/79; 257/80; 257/89; 257/90; 257/99; 257/678; 257/684
(58) Field of Search .......................... 257/79, 99, 80, 257/89, 90, 678, 684

(56) References Cited

U.S. PATENT DOCUMENTS 6,054,716 A * 4/2000 Sonobe et al. ............... 250/552
6,084,252 A * 7/2000 Isokawa et al.
6,472,688 B2 * 10/2002 Miyata

* cited by examiner

Primary Examiner—Fetsum Abraham
(74) Attorney, Agent, or Firm—Lowe Hauptman Gilman & Berner LLP

(57) ABSTRACT

Disclosed herein is a multi-color light emitting diode package. The multi-color light emitting diode package mounted thereon with at least three light emitting diodes comprises a substrate formed at the upper surface thereof with a pattern including three first terminals, and a single second terminal, first and second light emitting diodes, the diodes being mounted on a conductive mount pattern extending from the second terminal, and all formed at their upper surfaces with first and second electrodes, and a single zener diode chip having two zener diodes, the zener diode chip being mounted on the conductive mount pattern, and formed at a lower surface thereof with a single second electrode, and at an upper surface thereof with two first electrodes.

10 Claims, 4 Drawing Sheets

MULTI-COLOR LIGHT EMITTING DIODE PACKAGE

BACKGROUND OF THE INVENTION

1. Field of the Invention

The present invention relates to a light emitting diode (LED) package for displaying multiple colors, and more particularly to the structure of a light emitting diode package, which increases stability in relation to surge and electrostatic discharge (ESD), and improves a degree of freedom in design for miniaturization of the package.

2. Description of the Related Art

Generally, light emitting diodes are widely used in fields of lighting devices and display devices, because of their advantageous features of high brightness, a relatively long lifetime, low consumption of electrical power, and ability to allow miniaturization.

The light emitting diodes can be manufactured as a single package form for use. Such a package is constructed so that a plurality of light emitting diodes are mounted on a single substrate for emitting various different colors according to the user's requirements, resulting in a multi-color light emitting diode package. The multi-color light emitting diode package mainly takes the form of a three-color light emitting diode package obtained by combining red, green and blue light emitting diodes. Conventionally, the three-color light emitting diode package is configured in such a way that conductive patterns of a printed circuit board are first manufactured, and then three-color light emitting diodes are mounted at parts of the conductive patterns, respectively, for allowing electric power to be applied thereto connected in parallel for multi-color emission.

Among the semiconductor light emitting diodes for use in the three-color light emitting diode package, in particular, green and blue light emitting diodes are very vulnerable to electrostatic discharge and surge. To address such vulnerability, the green and blue light emitting diodes require to be connected to two zener diodes, respectively, in a reverse-polarity manner.

One example of conventional three-color light emitting diode packages is shown in FIG. 1a. FIG. 1a is a plan view illustrating the structure of the conventional three-color light emitting diode package, designated as reference numeral 10, having six terminals.

As shown in FIG. 1a, a substrate 11 of the conventional three-color light emitting diode package 10 comprises first to third anode terminal patterns A1, A2 and A3 formed at one side edge thereof, first to third cathode terminal patterns C1, C2 and C3 formed at the opposite side edge thereof, zener diode mount patterns P1 and P3 extending from the first and third anode terminal patterns A1 and A3, respectively, and a light emitting diode mount pattern P2 extending from the second cathode terminal pattern C2.

The light emitting diode mount pattern P2 is mounted with red, green and blue light emitting diodes 14, 12 and 15. The two zener diode mount patterns P1 and P2 are mounted with zener diodes 16 and 17, respectively. The zener diodes 16 and 17 are connected to the green and blue light emitting diodes 12 and 15, respectively, in a reverse-polarity manner, for addressing the vulnerability of the green and blue light emitting diodes 12 and 15 to electrostatic discharge and surge.

The arrangement structure of such a package also can be expressed as an equivalent circuit diagram as shown in FIG. 1b. As can be seen been from FIGS. 1a and 1b, the conventional three-color light emitting diode package 10 comprises six terminals, but further comprises the two zener diodes 16 and 17 in order to address vulnerability to electrostatic discharge and surge. This increases the number of patterns mounted on the substrate 11, resulting in the increased cross sectional area of the substrate 11.

As stated above, the conventional three-color light emitting diode package has many difficulties in miniaturization thereof because of the addition of zener diodes as well as increase of the pattern's number. Especially, since the at least two zener diodes to be connected to the green and blue light emitting diodes in a reverse-polarity manner, respectively, have to be additionally mounted on the substrate having a limited cross sectional area, there are many restrictions in the integration of circuit patterns of terminals and the mounted zener diodes.

In order to solve the above problems, and increase a degree of freedom in design as well as achieve miniaturization of a package, of course, omission of the zener diodes may be considered as an option. However, since the green and blue light emitting diodes are very vulnerable to electrostatic discharge and surge as stated above, the omission of the zener diodes may cause the breakdown of the corresponding diodes, resulting in more serious problems including the loss of light emitting function.

Therefore, it has been required to achieve the structure of a new multi-color light emitting diode package, which can achieve miniaturization of the package even while comprising zener diodes for green and blue light emitting diodes, and improve a degree of freedom in design in consideration of various requirements including the cross sectional area of radiation and the like.

SUMMARY OF THE INVENTION

Therefore, the present invention has been made in view of the above problems, and it is an object of the present invention to provide a multi-color light emitting diode package, which can achieve miniaturization thereof while reducing the number of terminals, by virtue of the application of a newly manufactured zener diode chip having two zener diodes.

It is another object of the present invention to provide a multi-color light emitting diode package, which can widen the range of optimal designs by using a single zener diode chip, thereby improving various performances thereof including radiation, and the like.

In accordance with the present invention, the above and other objects can be accomplished by the provision of a multi-color light emitting diode package mounted thereon with at least three light emitting diodes comprising: a substrate formed at an upper surface thereof with a pattern including three first terminals, and a single second terminal; first and second light emitting diodes among the at least three light emitting diodes, the first and second light emitting diodes being mounted on a conductive mount pattern extending from the second terminal, and all formed at their upper surfaces with first and second electrodes; and a single zener diode chip having two zener diodes, the zener diode chip being mounted on the conductive mount pattern, and formed at a lower surface thereof with a second electrode, and at an upper surface thereof with two first electrodes, wherein the second electrode of the first light emitting diode and one of the first electrodes provided in the single zener diode chip are connected to an associated one of the first terminals, and the second electrode of the second light emitting diode and the other one of the first electrodes provided in the single zener diode chip are connected to another associated one of the first terminals.

Preferably, the first and second light emitting diodes may be green and blue light emitting diodes, respectively.

Preferably, the other remaining light emitting diode among the at least three light emitting diodes may be a red light emitting diode, which is formed at an upper surface thereof with a first electrode, and at a lower surface thereof with a second electrode. In this case, the red light emitting diode may be mounted on the substrate so that it is positioned on a conductive mount pattern extending from the other remaining first terminal among the three first terminals, which is not connected with the first electrodes of the single zener diode chip, and the second electrode of the red light emitting diode may be connected to the second terminal or the mount pattern extending from the second terminal.

Alternatively, the other remaining light emitting diode among the at least three light emitting diodes may a red light emitting diode, which is formed at an upper surface thereof with a second electrode, and at a lower surface thereof with a first electrode. In this case, the red light emitting diode may be mounted on the substrate so that it is positioned on the conductive mount pattern extending from the second terminal, and the second electrode of the red light emitting diode may be connected to the other remaining first terminal among the three first terminals, which is not connected with the first electrodes of the single zener diode chip.

Preferably, the single zener diode chip employed in the present invention may comprise a first conductive substrate formed at a lower surface thereof with the second electrode, and two second conductive impurity areas defined at an upper portion of the first conductive substrate while being spaced apart from each other, each second conductive impurity area being formed at an upper surface thereof with one of the first electrodes.

As stated above, according to the present invention, it is possible to provide various optimal design solutions using the single zener diode chip.

According to the various optimal design solutions, preferably, the mount pattern extending from the second terminal may be positioned at a central region of the substrate, and the first terminals and the second terminal may be positioned at both side edges of the substrate.

Preferably, the red, blue and green light emitting diodes may be arranged in a triangular pattern. In this case, the single zener diode chip may be preferably positioned adjacent to the blue and green light emitting diodes of the triangular pattern.

Referring to the detail arrangement structure of the multi-color light emitting diode package according to the present invention, preferably, the two first terminals connected to the two first electrodes of the single zener diode chip, respectively, may be positioned at both side edges of the substrate adjacent to the blue and green light emitting diodes, respectively, and the other remaining first terminal and the second terminal may be positioned at both side edges of the substrate adjacent to the red light emitting diode, respectively.

Preferably, the first terminals may be cathode terminals, and the second terminal may be an anode terminal.

BRIEF DESCRIPTION OF THE DRAWINGS

The above and other objects, features and other advantages of the present invention will be more clearly understood from the following detailed description taken in conjunction with the accompanying drawings, in which:

FIG. 1b is an equivalent circuit diagram of the multi-color light emitting diode package shown in FIG. 1a;

FIG. 2b is an equivalent circuit diagram of the multi-color light emitting diode package shown in FIG. 2a;

DESCRIPTION OF THE PREFERRED EMBODIMENTS

Figure 1A:
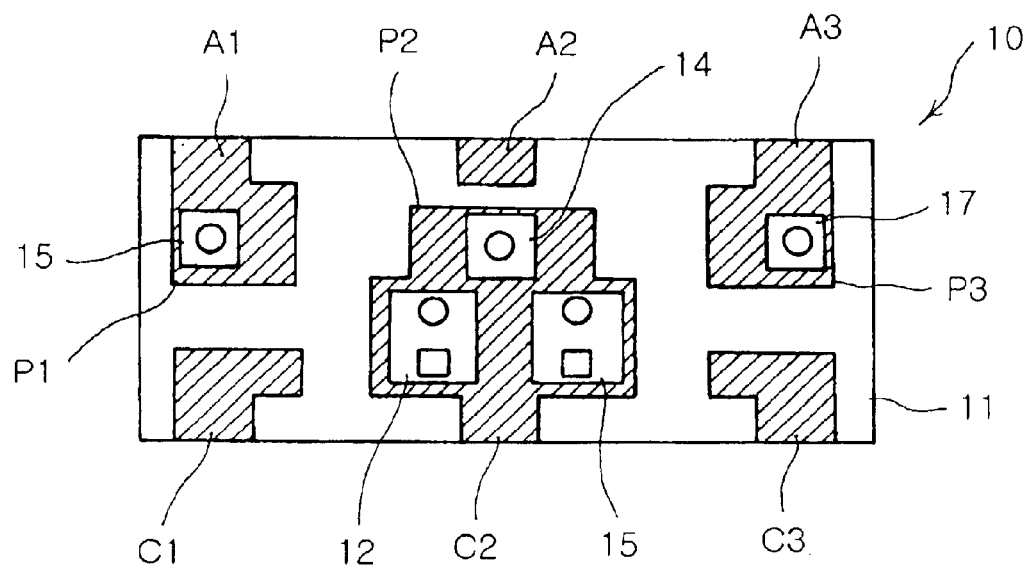
FIG. 1a is a plan view illustrating the structure of a multi-color light emitting diode package of the prior art.
Figure 1B:
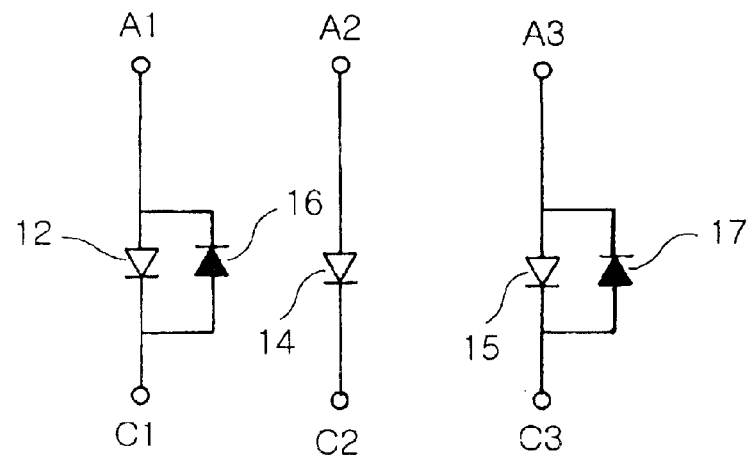
Figure 2A:
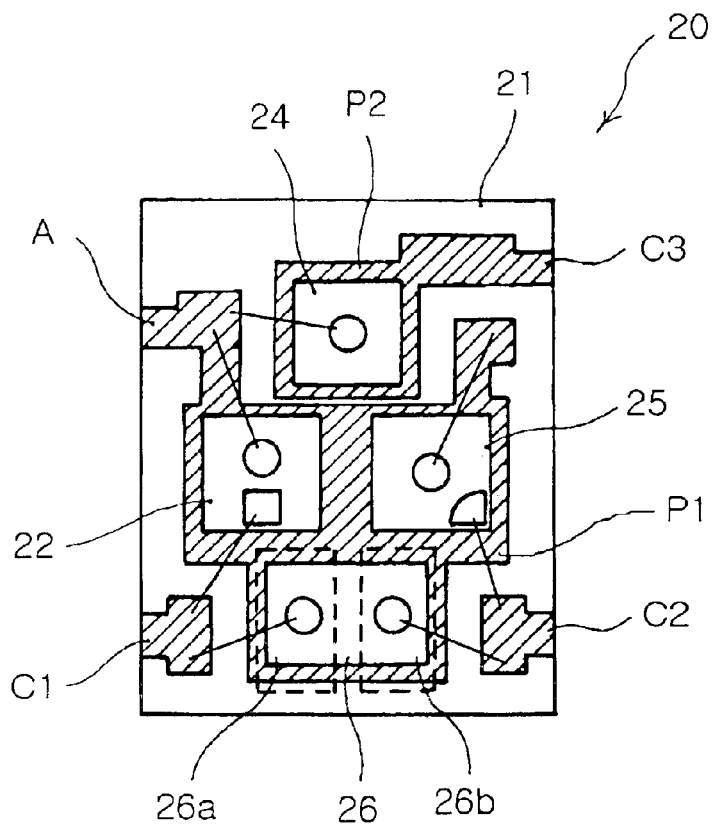
FIG. 2a is a plan view illustrating the structure of a multi-color light emitting diode package in accordance with one preferred embodiment of the present invention.
Figure 2B:
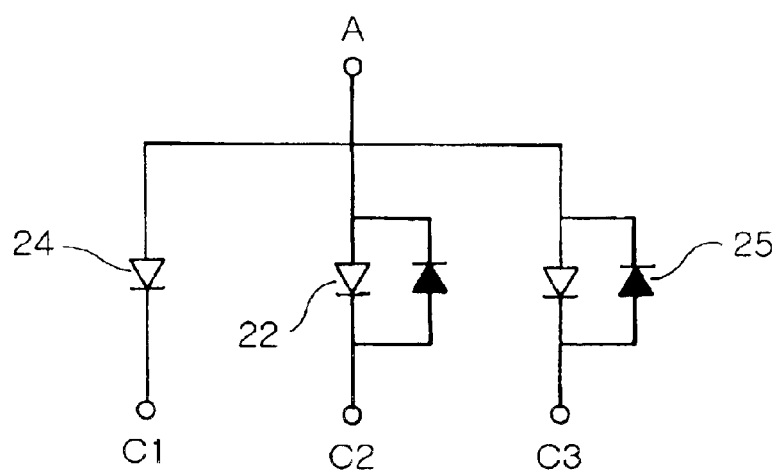

FIG. 2a is a plan view illustrating the structure of a multi-color light emitting diode package, designated as reference numeral 20, in accordance with one preferred embodiment of the present invention. FIG. 2b is an equivalent circuit diagram of the multi-color light emitting diode package shown in FIG. 2a.

As shown in FIG. 2a, the multi-color light emitting diode package 20 of the present invention comprises four terminals including one anode terminal A, and three cathode terminals C1, C2 and C3. The multi-color light emitting diode package 20 may comprise a red light emitting diode 24, a green light emitting diode, 22 and a blue light emitting diode 25.

The red light emitting diode 24 is formed at the upper surface thereof with a first electrode (shown as a circle), and at the lower surface thereof with a second electrode (not shown). Each of the blue light emitting diode 25 and the green light emitting diode 22 is configured so that both first electrode (shown as a circle) and second electrode (shown as a square in case of the green light emitting diode 22, or a fan-shape in case of the blue light emitting diode 25) are formed at the upper surface thereof.

The multi-color light emitting diode package of the present invention further comprises a single zener diode chip 26 having two zener diodes 26a and 26b. The single zener diode chip 26 may be formed at the lower surface thereof with a second electrode (not shown), and at the upper surface thereof with two first electrodes (shown as circles). The single zener diode chip 26 can be manufactured by forming two different conductive impurity areas on a single conductive substrate. The structure and manufacturing method of the single zener diode chip 26 employed in the present invention will be explained later in detail with reference to FIGS. 3a and 3b.

According to the present embodiment, the first electrodes and the second electrodes, provided in the red, green and blue light emitting diodes 24, 22 and 25, and the single zener diode chip 26, may be anode electrodes and cathode electrodes, respectively, or vice versa.

Considering conductive patterns formed at a substrate 21 of the multi-color light emitting diode package 20, the anode terminal A and the first cathode terminal C1 can be formed at one side edge of the substrate 21, and the second and third cathode terminals C2 and C3 can be formed at the opposite side edge of the substrate 21.

Conventionally, zener diodes are mounted on a separate conductive mount pattern, but the single zener diode chip 26 of the present invention is mounted on a mount pattern P1 extending from the anode terminal A, along with the green and blue light emitting diodes 22 and 25. Further, although the position of the red light emitting diode 24 may be freely changed as needed, according to the present embodiment, the red emitting diode 24 is mounted on a mount pattern P2 extending from the third cathode terminal C3, which dose not be connected with the first electrodes of the single zener diode chip 26.

As stated above, according to the present embodiment, as the two separate zener diodes 26a and 26b are combined into the single zener diode chip 26, they can be mounted on the single mount pattern P1 along with the green and blue light emitting diodes 22 and 25. In addition, as the anode terminal A is provided as a common terminal, the total number of terminals can be reduced to four. Therefore, it is possible to minimize a space required to mount the terminals and zener diodes, resulting in miniaturization of the package.

Considering the connection structure of the respective diodes and terminals with reference to FIG. 2a, the red light emitting diode 24 is mounted on the mount pattern P2 extending from the third cathode terminal C3 so that the second electrode provided at the lower surface thereof is connected to the third cathode terminal C3, and the first electrode at the upper surface thereof is connected to the anode terminal A by a wire. The green and blue light emitting diodes 22 and 25 are mounted on the mount pattern P1 extending from the anode terminal A so that the first and second electrodes of the green light emitting diode 22 are connected to the anode terminal A and the first cathode terminal C1 by wires, respectively, and the first and second electrodes of the blue light emitting diode 25 are connected to the anode terminal A and the second cathode terminal C2 by wires, respectively.

Although the first electrode of the blue light emitting diode 25 is shown as being connected to the mount pattern P1, since the conductive mount pattern P1 extends from the anode terminal A, it can be understood that the first electrode of the blue light emitting diode 25 is substantially connected to the anode terminal A.

The respective zener diodes 26a and 26b of the single zener diode chip 26 are mounted on the mount pattern P1 connected with the anode terminal A so that they are connected with the green and blue light emitting diodes 22 and 25, respectively, in a reverse-polarity manner. In this case, the second electrode formed at the lower surface of the single zener diode chip 26 is electrically connected to the anode terminal A, and the two first electrodes formed at the upper surface thereof are connected to the first and second cathode terminals C1 and C2, respectively, in a state wherein the second electrodes of the green and blue light emitting diodes 22 and 25 are connected to the first and second cathode terminals C1 and C2, respectively.

The structure of a circuit according to the embodiment shown in FIG. 2a is shown in FIG. 2b. As shown in FIG. 2b, the anode terminal A is provided as a common terminal, and the cathode terminals C1, C2 and C3 are provided to correspond to the red, green and blue light emitting diodes 24, 22 and 26, respectively, so that voltages to be applied to the cathode terminals C1, C2 and C3 are controlled, respectively, to emit desired colors.

The single zener diode chip 26 employed in the present invention is mounted as a single diode in view of the structure of the package, but substantially acts as two zener diodes. Therefore, in view of an equivalent circuit, the single zener diode chip 26 can be indicated as two zener diodes 26a and 26b, which are connected to the green and blue light emitting diodes 22 and 25, respectively, in a reverse-polarity manner.

Figure 3A:
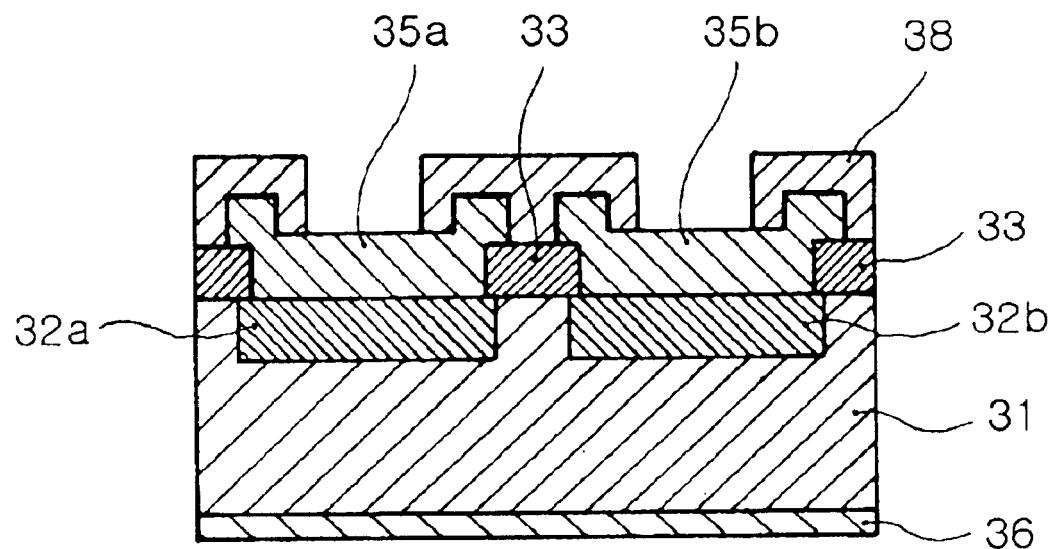
FIGS. 3a and 3b are a side sectional view and a plan view, respectively, illustrating a single zener diode chip having two zener diodes employed in the present invention.
Figure 3B:
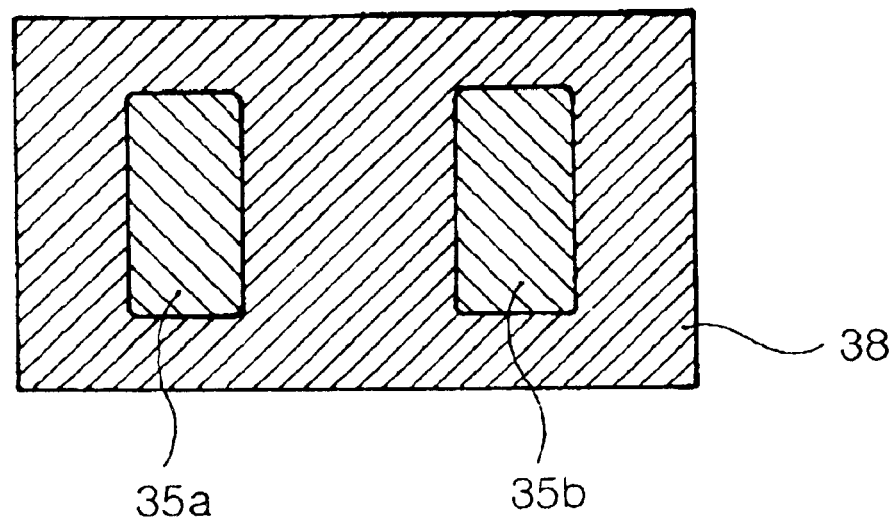

A single zener diode chip according to the present invention can be manufactured by forming two separate second impurity areas spaced apart from each other on a single first conductive substrate. FIGS. 3a and 3b illustrate one example of the single zener diode chip having two zener diodes, utilizable to the present invention.

FIGS. 3a and 3b are a side sectional view and a plan view, respectively, illustrating a single zener diode chip having two zener diodes, according to the present invention.

Referring to FIGS. 3a and 3b, the single zener diode chip comprises a first conductive substrate 31 formed at the lower surface with a first electrode 36, and second conductive impurity areas 32a and 32b provided in the upper portion of the first conductive substrate 31 while being spaced apart from each other. Onto the second conductive impurity areas 32a and 32b, two second electrodes 35a and 35b are formed at the upper surfaces thereof, respectively. In order to allow the two second electrodes 35a and 35b formed on the upper surfaces of the second conductive impurity areas 32a and 32b to be electrically separated from each other, an electrical isolating structure 33 made of certain materials such as oxides and nitrides is provided between the two second electrodes 35a and 35b. Furthermore, in order to allow parts of the second electrodes 35a and 35b to be exposed at the outside for the protection of the diode, a passivation layer 38 can be partially formed on the second electrodes 35a and 35b. The first conductive substrate 31 comprises a first conductive substrate layer with a low dopant density, and a first conductive epitaxial layer formed on the first conductive substrate layer with a high dopant density. The second conductive impurity areas 32a and 32b may be formed at two areas of the first conductive epitaxial layer. In this case, the electrical isolating structure 33 may extend to the first conductive epitaxial layer with the high dopant density.

As stated above, according to the present invention, it is possible to achieve the single zener diode chip having the two zener diodes, which are reduced in size by separating the two second electrodes 35a and 35b from each other while commonly sharing the first electrode 31.

Figure 4:
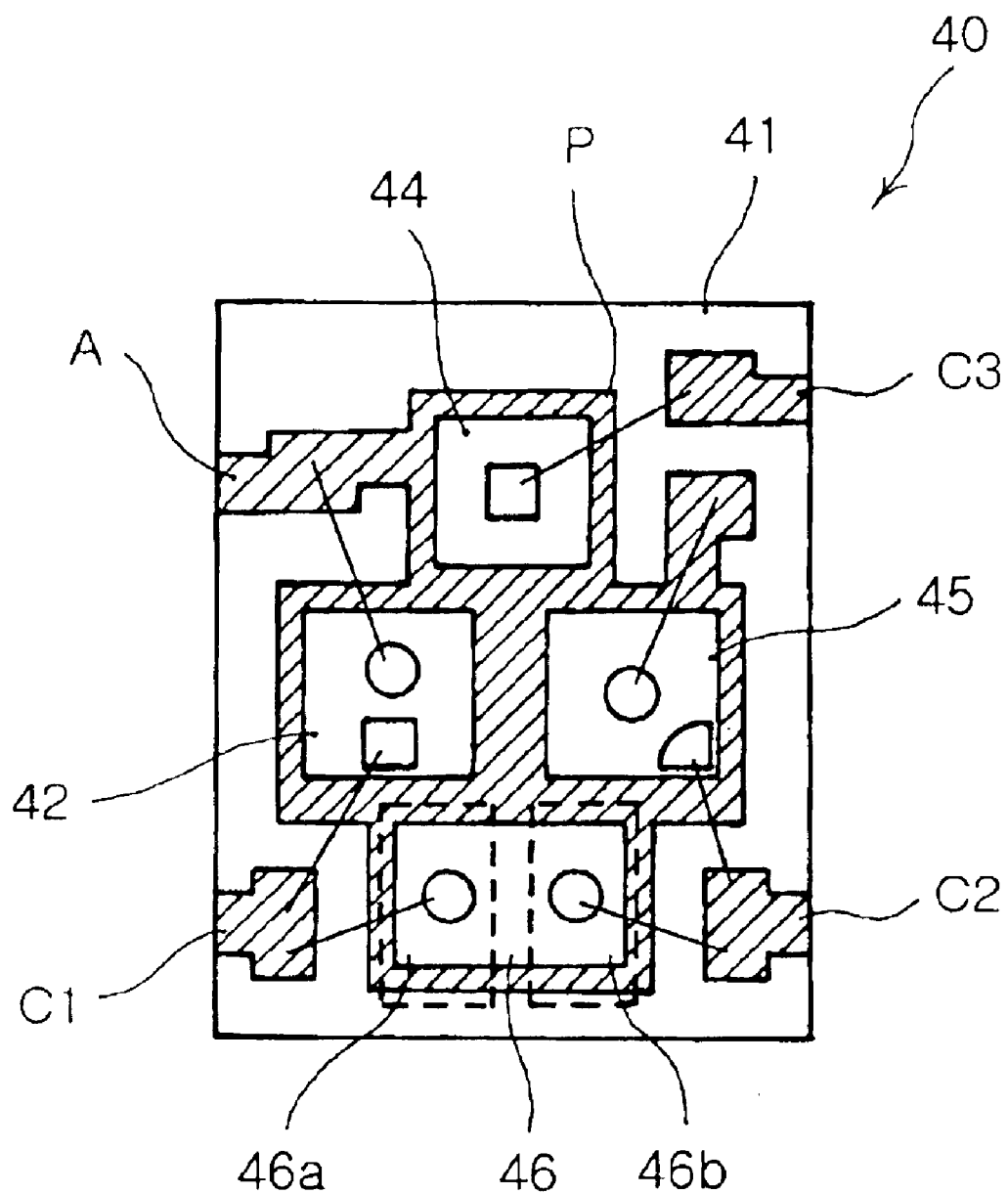
FIG. 4 is a plan view illustrating the structure of a multi-color light emitting diode package in accordance with another preferred embodiment of the present invention.

FIG. 4 is a plan view illustrating the structure of a multi-color light emitting diode package, designated as reference numeral 40, in accordance with another preferred embodiment of the present invention.

The present embodiment requires only one mount pattern, resulting in reduction of a cross sectional area required for the formation of such a pattern. In addition, the present embodiment provides a design solution capable of maximizing radiation performance of a conductive pattern having a high thermal conductivity by increasing the cross sectional area of the pattern onto which light emitting diodes are mounted.

Similar to the package 20 shown in FIG. 2a, the multi-color light emitting diode package 40 shown in FIG. 4 is formed to have a single anode terminal A and three cathode terminals C1, C2 and C3. A red light emitting diode 44 provided in the package 40 is formed at the upper surface thereof with a second electrode (shown as a square) and at the lower surface thereof with a first electrode (not shown). Green and blue light emitting diodes 42 and 45 provided in the package 40 are configured so that their first electrodes (shown as circles) and their second electrodes (shown as a square in case of the green light emitting diode 42, or a fan-shape in case of the blue light emitting diode 45) are formed at the upper surfaces thereof.

In order to protect the green and blue light emitting diodes 42 and 45 from electrostatic discharge and surge voltages, the package 40 of the present embodiment comprises a single zener diode chip 46 including two zener diodes 46a and 46b. The single zener diode chip 46 may be formed at the lower surface thereof with a single second electrode (not shown) and at the upper surface thereof with two first electrodes (shown as circles).

In the present embodiment, the first electrodes and the second electrodes, provided in the red, green and blue light emitting diodes 44, 42 and 45, and the single zener diode chip 46, are anode electrodes and cathode electrodes, respectively, or vice versa.

Considering a conductive pattern formed at a substrate 41 of the multi-color light emitting diode package 40, the anode terminal A and the first cathode terminal C1 can be formed at one side edge of the substrate 41, and the second and third cathode terminals C2 and C3 can be formed at the opposite side edge of the substrate 41.

All elements, that is, the red, green and blue light emitting diodes 44, 42, 45 and the single zener diode chip 46 are mounted on a mount pattern P extending from the anode terminal A. The red light emitting diode 44 is mounted on the mount pattern P extending from the anode terminal A so that the first electrode provided at the lower surface thereof is connected to the anode terminal A, and the second electrode provided at the upper surface thereof is connected to the third cathode terminal C3 by a wire. The green and blue light emitting diodes 42 and 45 are mounted on the mount pattern P extending from the anode terminal A so that the first and second electrodes of the green light emitting diode 42 are connected to the anode terminal A and the first cathode terminal C1 by wires, respectively, and the first and second electrodes of the blue light emitting diode 45 are connected to the anode terminal A and the second cathode terminal C2 by wires, respectively.

The zener diodes 46a and 46b of the single zener diode chip 46 are mounted on the mount pattern P connected to the anode terminal A so that they are connected to the green and blue light emitting diodes 42 and 45, respectively, in a reverse-polarity manner. In this case, the second electrode formed at the lower surface of the single zener diode chip 46 is electrically connected to the anode terminal A, and the two first electrodes formed at the upper surface thereof are connected to the first and second cathode terminals C1 and C2, respectively, in a state wherein the second electrodes of the green and blue light emitting diodes 42 and 45 are connected to the first and second cathode terminals C1 and C2, respectively.

Where the package 40 of the present embodiment is manufactured so that elements thereof have the same sizes and pattern shapes, and the like as those of the package 20 shown in FIG. 2a, the mount pattern P shown in FIG. 4 has a size substantially equal to the total size of the two mount is patterns P1 and P2 shown in FIG. 2a. Therefore, the size of the mount pattern P, onto which the light emitting diodes 42, 44 and 45 having a radiation function are mounted, is relatively increased, resulting in improved radiation performance as compared with the embodiment shown in FIG. 2.

As can be seen from the above description, the present invention provides an advantage in that the package can be variously designed according to the user's requirements while achieving miniaturization thereof as compared with the prior art.

As apparent from the above description, the present invention provides a multi-color light emitting diode package, which can achieve miniaturization thereof even while protecting green and blue light emitting diodes provided therein from electrostatic discharge and surge voltages using zener diodes, and improve a degree of freedom in design in consideration of various requirements including the cross sectional area of radiation and the like according to the user's requirements.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-color light emitting diode package mounted thereon with at least three light emitting diodes comprising:
    a substrate formed at an upper surface thereof with a pattern including three first terminals, and a single second terminal;
    first and second light emitting diodes among the at least three light emitting diodes, the first and second light emitting diodes being mounted on a conductive mount pattern extending from the second terminal, and all formed at their upper surfaces with first and second electrodes; and
    a single zener diode chip having two zener diodes, the zener diode chip being mounted on the conductive mount pattern, and formed at a lower surface thereof with a second electrode, and at an upper surface thereof with two first electrodes,
    wherein the second electrode of the first light emitting diode and one of the first electrodes provided in the single zener diode chip are connected to an associated one of the first terminals, and the second electrode of the second light emitting diode and the other one of the first electrodes provided in the single zener diode chip are connected to another associated one of the first terminals.

2. The package as set forth in claim 1, wherein the first and second light emitting diodes are green and blue light emitting diodes, respectively.

3. The package as set forth in claim 2, wherein:
    the other remaining light emitting diode among the at least three light emitting diodes is a red light emitting diode, which is formed at an upper surface thereof with a first electrode, and at a lower surface thereof with a second electrode;
    the red light emitting diode is mounted on the substrate so that it is positioned on a conductive mount pattern extending from the other remaining first terminal among the three first terminals, which is not connected with the first electrodes of the single zener diode chip; and
    the second electrode of the red light emitting diode is connected to the second terminal or the mount pattern extending from the second terminal.

4. The package as set forth in claim 2, wherein:
    the other remaining light emitting diode among the at least three light emitting diodes is a red light emitting diode, which is formed at an upper surface thereof with a second electrode, and at a lower surface thereof with a first electrode;
    the red light emitting diode is mounted on the substrate so that it is positioned on the conductive mount pattern extending from the second terminal; and the second electrode of the red light emitting diode is connected to the other remaining first terminal among the three first terminals, which is not connected with the first electrodes of the single zener diode chip.

5. The package as set forth in claim 2, wherein the red, blue and green light emitting diodes are arranged in a triangular pattern.

6. The package as set forth in claim 5, wherein the single zener diode chip is positioned adjacent to the blue and green light emitting diodes of the triangular pattern.

7. The package as set forth in claim 6, wherein:
the two first terminals connected to the two first electrodes of the single zener diode chip, respectively, are positioned at both side edges of the substrate adjacent to the blue and green light emitting diodes, respectively; and
the other remaining first terminal and the second terminal are positioned at both side edges of the substrate adjacent to the red light emitting diode, respectively.

8. The package as set forth in claim 1, wherein the single zener diode chip comprises a first conductive substrate formed at a lower surface thereof with the second electrode, and two second conductive impurity areas defined at an upper portion of the first conductive substrate while being spaced apart from each other, each second conductive impurity area being formed at an upper surface thereof with one of the first electrodes.

9. The package as set forth in claim 1, wherein the mount pattern extending from the second terminal is positioned at a central region of the substrate, and the first terminals and the second terminal are positioned at both side edges of the substrate.

10. The package as set forth in claim 1, wherein the first terminals are cathode terminals, and the second terminal is an anode terminal.

* * * * *